United States Patent
Shim et al.

(10) Patent No.: US 6,787,970 B2
(45) Date of Patent: Sep. 7, 2004

(54) TUNING OF PACKAGED FILM BULK ACOUSTIC RESONATOR FILTERS

(75) Inventors: Dong S. Shim, San Jose, CA (US); Jose Maiz, Portland, OR (US); Li-Peng Wang, Santa Clara, CA (US); Qing Ma, San Jose, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/353,276

(22) Filed: Jan. 29, 2003

(65) Prior Publication Data

US 2004/0145272 A1 Jul. 29, 2004

(51) Int. Cl.[7] .............................................. H01L 41/04
(52) U.S. Cl. ....................................................... 310/312
(58) Field of Search ........................................ 310/312

(56) References Cited

U.S. PATENT DOCUMENTS

| | | | | |
|---|---|---|---|---|
| 4,435,441 A | * | 3/1984 | Mariani et al. ................ 427/10 |
| 4,985,655 A | * | 1/1991 | Jensik et al. ................. 310/344 |
| 5,138,214 A | * | 8/1992 | Nakai et al. ................. 310/312 |
| 6,456,173 B1 | * | 9/2002 | Ella et al. ................... 333/188 |
| 6,476,536 B1 | * | 11/2002 | Pensala ....................... 310/312 |

FOREIGN PATENT DOCUMENTS

| | | | | |
|---|---|---|---|---|
| JP | 1-227512 | * | 9/1989 | ............ H03H/9/02 |
| JP | 4-56508 | * | 2/1992 | .............. 333/219.1 |
| JP | 9-172348 | * | 6/1997 | ............ H03H/9/19 |
| JP | 11-145769 | * | 5/1999 | ............ H03H/9/19 |
| JP | 2001-85963 | * | 3/2001 | ............ H03H/3/04 |

* cited by examiner

Primary Examiner—Thomas M. Dougherty
(74) Attorney, Agent, or Firm—Trop, Pruner & Hu, P.C.

(57) ABSTRACT

Packaged film bulk acoustic resonators may be tuned after packaging by exposing them to irradiation. In one embodiment, transparent covers may be provided so that the film bulk acoustic resonator filter may be exposed to laser irradiation to either add or remove material from the filter and to thereby adjust its frequency.

27 Claims, 2 Drawing Sheets

TUNING OF PACKAGED FILM BULK ACOUSTIC RESONATOR FILTERS

BACKGROUND

This invention relates generally to radio frequency filters, including film bulk acoustic resonators (FBARs).

Film bulk acoustic resonators have many advantages over other techniques, such as surface acoustic wave (SAW) devices and ceramic filters, particularly at high frequencies. For example, SAW filters begin to experience excessive insertion losses above 2.4 gigahertz and ceramic filters are much larger in size and become increasingly difficult to fabricate at increased frequencies.

A conventional FEAR filter may include two sets of FBARs to achieve the desired filter response. The series FBARs have one resonant frequency and the shunt FBARs have another resonant frequency. The frequency of an FBAR is mainly determined by the thickness of its piezoelectric film, which approximately equals a half wavelength of the acoustic wave. The frequencies of FBARs need to be precisely set to achieve a desired filter response.

For example, for a 2 gigahertz FBAR, the thickness of the piezoelectric film may be approximately 2 microns. A one percent error or variation in piezoelectric film thickness may change the frequency of the filter by approximately 20 megahertz, which is not acceptable if a frequency precision or accuracy of 16 megahertz is required.

A variety of techniques are known for adjusting the frequency of an FBAR filter. However, the frequency of an FBAR filter may shift during or after packaging.

Therefore, there may be a need to tune the frequency of FBAR filters that were tuned prior to packaging, again after packaging.

DETAILED DESCRIPTION

Figure 1:
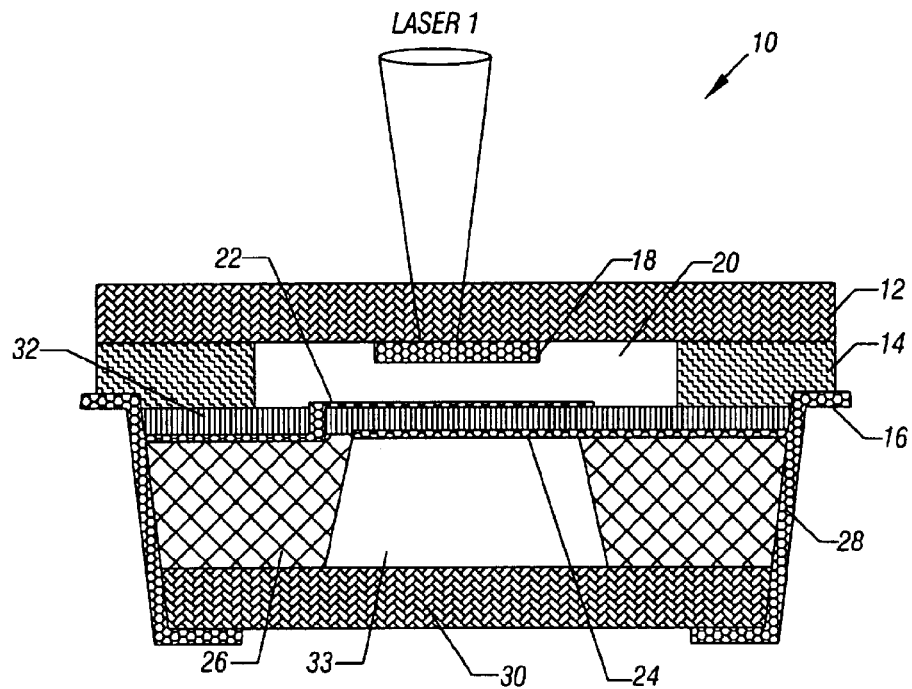
FIG. 1 is an enlarged cross-sectional view of one embodiment of the present invention.

Referring to FIG. 1, a film bulk acoustic resonator 10 may include a silicon substrate 26 having a cavity 33 formed therein. A piezoelectric film 32 may be formed over a lower electrode 24 and under an upper electrode 22. That structure may then be enclosed beneath a transparent cover 12 and above a transparent cover 30. Contacts 28 may be provided for electrically connecting to the upper and lower electrodes 22 and 24. A sealing material 14 seals the cover 12 to the rest of the film bulk acoustic resonator 10.

A tuning material 18 may be deposited on the inner surface of the upper transparent cover 12. In one embodiment, the material 18 may be patterned as an array of dots. After the filter 10 has been fabricated with a frequency higher than the design or intended value, the frequency of the filter 10 can be tuned to the desired value by decomposing the tuning material 18. In one embodiment, a laser (laser 1) may be utilized to expose all or part of the tuning material 14, to decompose that material, and to cause it to be deposited on the upper electrode 22 through the cavity 20.

The filter 10 frequency is then altered due to the mass loading effect or the change of the affected filter thickness. The tuning material may be a non-conductive material, such as $Al_2O_3$, to avoid any electrical shorting.

The size of the spot created on the material 18 by the laser may be smaller than the size of the tuning material 18 so that scanning is needed to cover the full device. Alternatively, the size of the spot may be larger, so only one shot is needed to finish the tuning of each filter 10.

Figure 2:
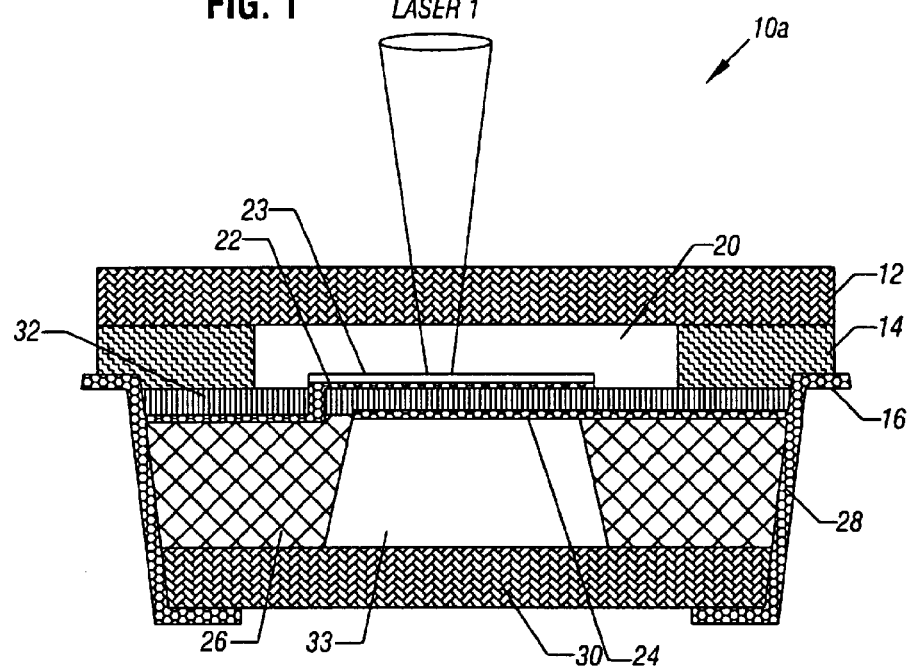
FIG. 2 is an enlarged cross-sectional view of another embodiment of the present invention.

Referring next to FIG. 2, in accordance with another embodiment of the present invention, material may be removed from the upper electrode 22 to tune the filter after packaging. In this case, the filter 10a may be formed with a target frequency lower than the design value. Laser light is shined through the upper cover 12 and focused on the top surface of the filter electrode 22. The filter 10a can be tuned to the desired value by removing part of, or thinning, the top electrode 22 of the filter 10a. Alternatively, an additional layer 23 may be positioned on top of the electrode 22, which then may be selectively removed.

The size of the laser spot on the electrode 22 may be smaller than the size of the electrode 22 so that scanning is needed to cover the entire electrode 22. Alternatively, the size of the laser spot may be larger, so that only one shot is needed to finish tuning each filter 10a.

Figure 3:
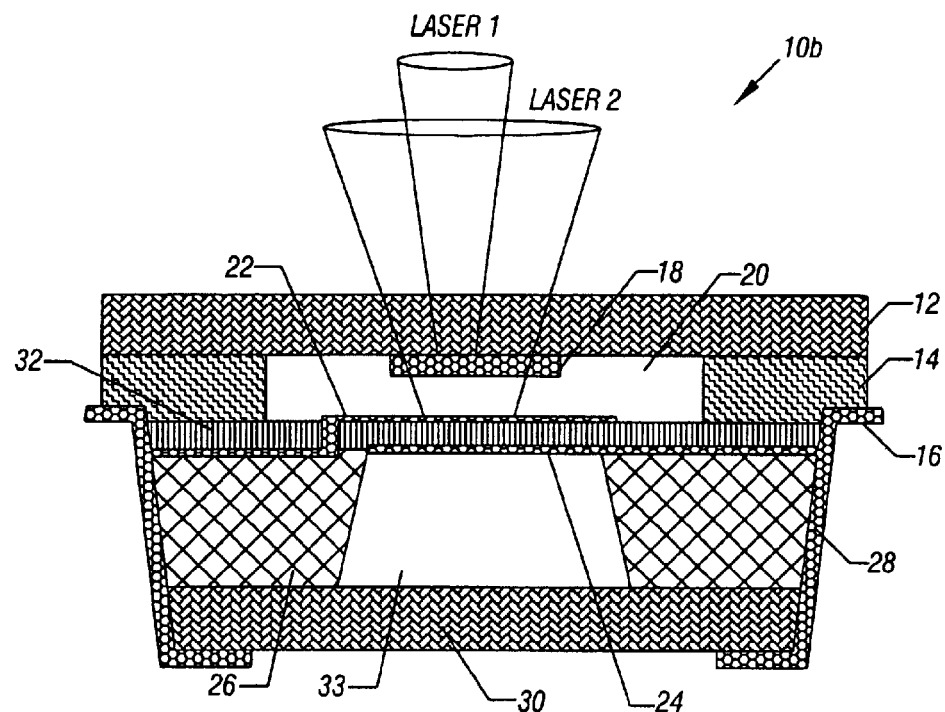
FIG. 3 is an enlarged cross-sectional view of another embodiment of the present invention.

Referring next to FIG. 3, an approach using both addition and removal of material for tuning is illustrated. In this case, two lasers, laser 1 and laser 2, may be used so that both addition and removal of material can be applied. In this example, laser 1 is used for addition of material from the material 18 to the electrode 22. The laser 2 is used for removal of material from the electrode 22.

Two different frequencies of laser may be used for this purpose. Advantageously, in one embodiment, the tuning material 18 may be transparent to the light generated by the laser 2, but is absorbed by the light generated by the laser 1. Alternatively, the material 18 may be patterned or positioned to permit the laser 2 to pass without affecting the material 18 while the laser 1 is aimed to hit the patterned or positioned tuning material 18.

Figure 4:
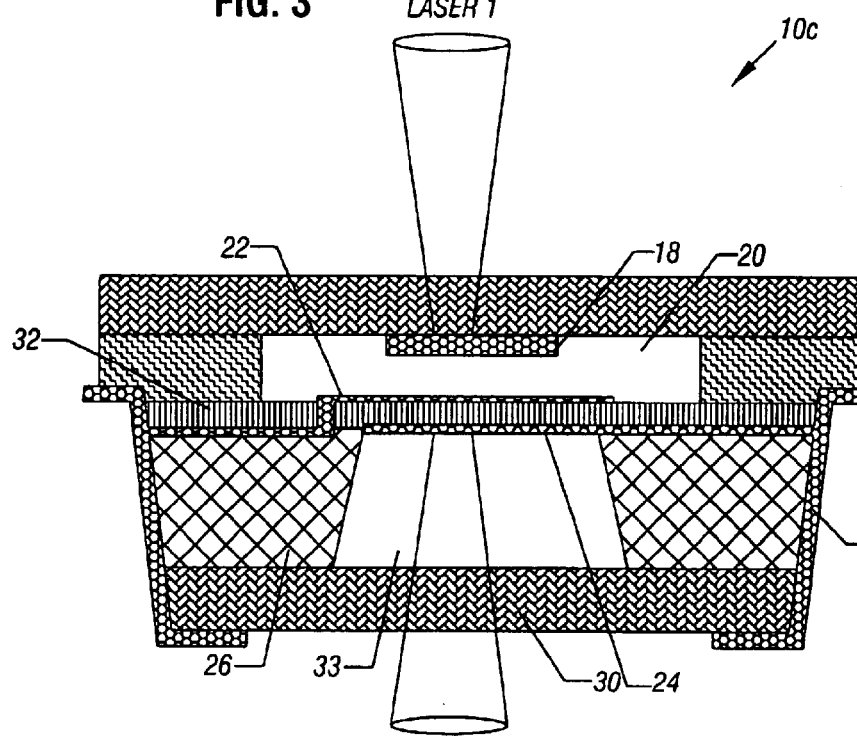
FIG. 4 is an enlarged cross-sectional view of another embodiment of the present invention.

Referring to FIG. 4, in accordance with another embodiment of the present invention, addition and removal may be accomplished from opposite sides of the package 10c using the transparent covers 12 and 30. For example, material may be added, when a frequency reduction is needed, from the top side using the laser 1 to cause material to be added to electrode 22. Material may be removed from the electrode 24, when a frequency increase is needed, from the bottom side using laser 2. In this way, gravity may be used to assist the tuning process.

While an embodiment is illustrated using laser irradiation, other forms of exposure may be used including energy exposure such as heat exposure and other types of irradiation, such as infrared irradiation, may be applied through the package to tune a resonator.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

exposing a pair of irradiation alterable layers of a film bulk acoustic resonator to irradiation through a cover; and changing the frequency of said resonator through said exposure by altering one but not the other of said irradiation alterable layers.

2. The method of claim 1 wherein exposing to irradiation includes exposing the resonator to laser irradiation.

3. The method of claim 1 including exposing the resonator through a transmissive cover.

4. The method of claim 3 including exposing the resonator through a transparent cover.

5. The method of claim 3 including exposing the resonator through a pair of opposed covers.

6. The method of claim 1 including increasing the frequency of the resonator.

7. The method of claim 1 including decreasing the frequency of the resonator.

8. The method of claim 1 including heating a material on said cover and causing said material to be deposited on said resonator.

9. The method of claim 1 including enabling the addition or subtraction of material from said resonator to increase or decrease the frequency of said resonator.

10. A film bulk acoustic resonator comprising:
a first electrode;
a piezoelectric film;
a second electrode, said piezoelectric film being positioned between said first and second electrodes; and
a pair of irradiation alterable layers, a first of said layers being responsive to irradiation having a first characteristic and the second of said layers being response to irradiation of a second characteristic, said first and second characteristics being different.

11. The resonator of claim 10 wherein said package includes a cover to enable exposure of the interior of said package from outside said package.

12. The resonator of claim 10 wherein said package enables irradiation of the interior of said package.

13. The resonator of claim 10 including a cover to enable light to pass through said cover.

14. The resonator of claim 10 including a cover that is substantially transparent.

15. The resonator of claim 10 including a pair of covers on opposite sides of said piezoelectric film, said covers to enable exposure of the interior of said package.

16. The resonator of claim 15 wherein both of said covers are substantially transparent.

17. The resonator of claim 12 wherein one of said layers being removable by exposure to irradiation through said cover from outside said package.

18. The resonator of claim 11 wherein one of said layers is formed on said cover over one of said electrodes, said layer being heatable by irradiation to cause said layer to be deposited on one of said electrodes.

19. The resonator of claim 11 wherein said cover is arranged to enable irradiation of one of said electrodes to either add or remove material from said electrode.

20. A film bulk acoustic resonator comprising:
a first electrode;
a piezoelectric film;
a second electrode, said piezoelectric film being located between said first and second electrodes; and
a package surrounding said first and second electrodes and said piezoelectric film, said package including a pair of opposed light transmissive covers to enable exposure of the interior of said package by different light irradiation sources to change the frequency of said resonator from outside said package.

21. The resonator of claim 20 wherein said cover is substantially transparent.

22. The resonator of claim 20 wherein both of said covers are substantially transparent.

23. The resonator of claim 20 including a layer of material over one of said electrodes, said layer of material being removable by exposure to irradiation through said cover from outside said package.

24. The resonator of claim 20 including material formed on said cover over one of said electrodes, said material being heatable from outside said package to cause said material to be deposited on one of said electrodes.

25. The resonator of claim 24 wherein said material is thermally decomposable.

26. The resonator of claim 20 wherein said cover is arranged to enable irradiation of one of said electrodes to remove material from said electrode.

27. The resonator of claim 20 wherein said cover is arranged to enable irradiation of one of said electrodes to add material to said electrode.

* * * * *